(12) United States Patent
Weld et al.

(10) Patent No.: US 9,673,135 B2
(45) Date of Patent: Jun. 6, 2017

(54) SEMICONDUCTOR DEVICE HAVING MIRROR-SYMMETRIC TERMINALS AND METHODS OF FORMING THE SAME

(71) Applicant: Altera Corporation, San Jose, CA (US)

(72) Inventors: John D. Weld, San Jose, CA (US); Douglas Dean Lopata, San Jose, CA (US); Wei Zhang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 175 days.

(21) Appl. No.: 14/153,606

(22) Filed: Jan. 13, 2014

(65) Prior Publication Data

US 2015/0200155 A1    Jul. 16, 2015

(51) Int. Cl.
*H01L 23/48* (2006.01)
*H01L 23/495* (2006.01)
(Continued)

(52) U.S. Cl.
CPC .... *H01L 23/49541* (2013.01); *H01L 21/4889* (2013.01); *H01L 23/495* (2013.01); *H01L 23/49537* (2013.01); *H01L 23/49562* (2013.01); *H01L 23/49575* (2013.01); *H01L 24/06* (2013.01); *H01L 24/49* (2013.01); *H01L 29/7817* (2013.01); *H01L 23/49503* (2013.01); *H01L 23/49513* (2013.01); *H01L 2224/04042* (2013.01); *H01L 2224/05554* (2013.01); *H01L 2224/0603* (2013.01);
(Continued)

(58) Field of Classification Search
CPC ............. H01L 23/49541; H01L 23/293; H01L 29/7817; H01L 21/4889; H01L 21/56; H01L 23/4952; H01L 23/49575

USPC ......................................................... 257/337
See application file for complete search history.

(56) References Cited

U.S. PATENT DOCUMENTS 5,161,304 A    11/1992 Queyssac et al.
5,621,635 A     4/1997 Takiar
(Continued)

OTHER PUBLICATIONS

U.S. Appl. No. 14/091,739, filed Nov. 27, 2013 entitled "Semiconductor Including Alternating Source and Drain Regions, and Respective Source and Drain Metallic Strips" to Ashraf W. Loth, 163 pages.

*Primary Examiner* — Julia Slutsker
*Assistant Examiner* — Dmitriy Yemelyanov
(74) *Attorney, Agent, or Firm* — Fletcher Yoder, P.C.

(57) ABSTRACT

A semiconductor device having substantially minor-symmetric terminals and methods of forming the same. In one embodiment, the semiconductor device includes a semiconductor switch having a control node and a switched node, the switched node being coupled to first and second output terminals of the semiconductor device, the first and second output terminals being positioned in a substantially minor-symmetric arrangement on the semiconductor device. The semiconductor device also includes a control element having first and second input nodes and an output node, the first and second input nodes being coupled to first and second input terminals, respectively, of the semiconductor device and the output node being coupled to the control node of the semiconductor switch, the first and second input terminals being substantially center-positioned on the semiconductor device.

20 Claims, 7 Drawing Sheets

(51) Int. Cl.
*H01L 29/78* (2006.01)
*H01L 21/48* (2006.01)
*H01L 23/00* (2006.01)

(52) U.S. Cl.
CPC ............... *H01L 2224/48095* (2013.01); *H01L 2224/48247* (2013.01); *H01L 2224/48465* (2013.01); *H01L 2224/4911* (2013.01); *H01L 2224/4917* (2013.01); *H01L 2924/00014* (2013.01); *H01L 2924/13091* (2013.01); *H01L 2924/181* (2013.01); *H01L 2924/19107* (2013.01)

(56) References Cited

U.S. PATENT DOCUMENTS

| | | |
|---|---|---|
| 6,483,177 B1 | 11/2002 | Yee |
| 7,015,544 B2 | 3/2006 | Lotfi et al. |
| 7,019,505 B2 | 3/2006 | Dwarakanath et al. |
| 7,038,438 B2 | 5/2006 | Dwarakanath et al. |
| 7,230,302 B2 | 6/2007 | Lotfi et al. |
| 7,330,017 B2 | 2/2008 | Dwarakanath et al. |
| 8,153,473 B2 | 4/2012 | Lotfi et al. |
| 8,266,793 B2 | 9/2012 | Lotfi et al. |
| 2006/0006863 A1 | 1/2006 | Adachi et al. |
| 2006/0038225 A1* | 2/2006 | Lotfi ..................... H02M 3/156 257/335 |
| 2010/0087036 A1* | 4/2010 | Lotfi ................. H01L 23/49589 438/122 |
| 2012/0273929 A1* | 11/2012 | Jiang ................. H01L 23/49572 257/673 |

\* cited by examiner

SEMICONDUCTOR DEVICE HAVING MIRROR-SYMMETRIC TERMINALS AND METHODS OF FORMING THE SAME

TECHNICAL FIELD

The present invention is directed, in general, to electronic devices and, in particular, to a semiconductor device and module having substantially mirror-symmetric terminals and methods of forming the same.

BACKGROUND

Substantial progress has been made in recent years in integrating control circuits formed with operational amplifiers, comparators, and passive circuit elements with power processing elements such as power semiconductor switches into a common package. An area that has been challenging, particularly for use in a compact module such as a point-of-load power module, is to produce a semiconductor device that provides a die design convenient for opposing sides (e.g., a left- and a right-side) of a package assembly.

An area that introduces further packaging challenges is the need to provide point-of-load power to multiple loads in a confined area, for example, in a limited area of a printed circuit board. A particular load might require different load voltages, such as 3.3 or 2.5 volts ("V"), or two co-located processors might each require the same voltage such as 2.5 V. Such powering arrangements can provide substantial layout challenges with respect to a printed circuit board.

Conventional power arrangements generally result in a nonsymmetric layout for multiple loads in which one load is fed from a power module from one direction and a second load from an opposing direction. Semiconductor devices employed to construct a point-of-load power converter embodied in a power module for such arrangements are also generally formed with a nonsymmetric layout, which does not facilitate a layout in symmetric or parallel directions.

A further area that affects broad market issues is the physical size of a power module, which introduces thermal design challenges. A continuing area affecting the design of a compact power module that should be addressed is the ability to dissipate heat produced by passive circuit elements in a compact physical structure, as well as heat produced by active circuit elements. The larger passive elements such as inductors are difficult to include in an integrated semiconductor device that may include an active element such as a power semiconductor switch and a control element on a same semiconductor die. Without compromising a power rating of the power module, the dissipation of heat from such active and passive sources is performed in a challenging external thermal environment. The integration of larger passive elements with an active element in a common package would enable the production of very compact power modules.

Thus, there is an unanswered need to create a package structure for a module such as a power module including multiple circuits such as power converters that employs a semiconductor die design that can be applied for opposing side (e.g., either left-side or right-side) package assembly. The resulting package structure in turn should enable opposing side positioning for an end-product layout on a printed circuit board. Accordingly, what is needed in the art is module architecture including a semiconductor device (e.g., a power semiconductor switch integrated with a control element) and method of forming the same that overcomes layout and packaging challenges of current designs.

SUMMARY OF THE INVENTION

These and other problems are generally solved or circumvented, and technical advantages are generally achieved, by advantageous embodiments of the present invention, which include a semiconductor device having substantially mirror-symmetric terminals and methods of forming the same. In one embodiment, the semiconductor device includes a semiconductor switch having a control node and a switched node, the switched node being coupled to first and second output terminals of the semiconductor device, the first and second output terminals being positioned in a substantially minor-symmetric arrangement on the semiconductor device. The semiconductor device also includes a control element having first and second input nodes and an output node, the first and second input nodes being coupled to first and second input terminals, respectively, of the semiconductor device and the output node being coupled to the control node of the semiconductor switch, the first and second input terminals being substantially center-positioned on the semiconductor device.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale

DETAILED DESCRIPTION OF ILLUSTRATIVE EMBODIMENTS

The making and using of the presently preferred embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Embodiments will be described in a specific context, namely, a semiconductor device including a semiconductor switch (such as a power semiconductor device, e.g., a metal oxide semiconductor field effect transistor ("MOSFET") embodied in a laterally diffused metal oxide semiconductor ("LDMOS") device) with terminals formed in a substantially mirror-symmetric arrangement, and a module incorporating the semiconductor device with terminals formed in a substantially minor-symmetric arrangement and methods of forming the same. While the principles of the present invention will be described in the environment of a power module employing a power semiconductor device, any application or related semiconductor technology that may benefit from a semiconductor device that can enable a substantially minor-symmetric arrangement in a module is well within the broad scope of the present invention.

In an embodiment, a module may include integrated circuits (either in bare die or in an encapsulated form embodied in semiconductor devices) coupled (e.g., adhesively mounted) to a conductive substrate (e.g., a leadframe), and electrically coupled thereto with wire bonds, as well as a discrete passive element coupled thereon. An encapsulant such as plastic molded material (e.g., an epoxy material) is placed about the semiconductor devices and discrete passive element, and any additional elements to provide environmental and mechanical protection as well as a thermally conductive covering to facilitate heat dissipation during operation of the module. Other molding materials and processes as well as electronic devices constructed without an encapsulant are well within the broad scope of the present invention. It should be understood that the module may form, at least in part, a power management system, which itself is often referred to as a power management integrated circuit.

As will become more apparent, a discrete passive element may be embodied, without limitation, in an inductor or a transformer. In addition, a semiconductor device may include active elements (e.g., a power semiconductor switch) and passive elements (e.g., diodes, resistors, capacitors) and circuits such as controllers and drivers formed with elements such as operational amplifiers and comparators. Of course, the broad scope of the present invention is not limited to the particular elements that form the semiconductor device.

Figure 1:
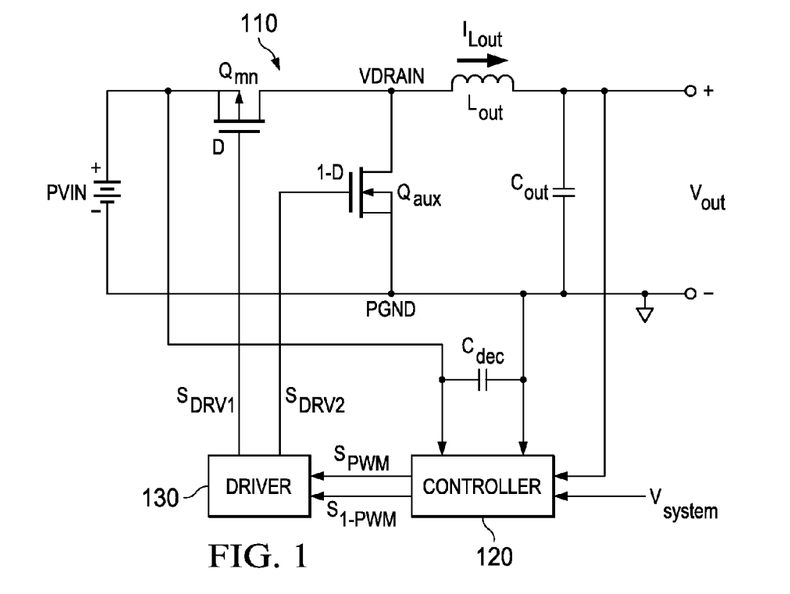
FIG. 1 illustrates a schematic diagram of an embodiment of a power converter including power conversion circuitry employable in a module.

Referring initially to FIG. 1, illustrated is a schematic diagram of an embodiment of a power converter including power conversion circuitry employable in a module. The power converter includes a power train 110, a controller 120 and a driver 130 including control circuit elements, and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 receives an input voltage PVIN from a source of electrical power (represented by a battery) at an input thereof and provides a regulated output voltage $V_{out}$ to power, for instance, a microprocessor at an output thereof. In keeping with the principles of a buck converter topology, the output voltage $V_{out}$ is generally less than the input voltage PVIN such that a switching operation of the power converter can regulate the output voltage $V_{out}$. An active element such as a semiconductor switch (e.g., a main power semiconductor switch $Q_{mn}$) is enabled to conduct for a primary interval (generally co-existent with a primary duty cycle "D" of the main power semiconductor switch $Q_{mn}$) and couples the input voltage PVIN to an output filter inductor $L_{out}$. During the primary interval, an inductor current $I_{Lout}$ flowing through the output filter inductor $L_{out}$ increases as a current flows from the input to the output of the power train 110. A portion of the inductor current $I_{Lout}$ is filtered by the output filter capacitor $C_{out}$.

During a complementary interval (generally co-existent with a complementary duty cycle "1-D" of the main power semiconductor switch $Q_{mn}$), the main power semiconductor switch $Q_{mn}$ is transitioned to a non-conducting state and another active element such as another semiconductor switch (e.g., an auxiliary power semiconductor switch $Q_{aux}$) is enabled to conduct. The auxiliary power semiconductor switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary power semiconductor switches $Q_{mn}$, $Q_{aux}$ may be adjusted to maintain a regulation of the output voltage $V_{out}$ of the power converter. Those skilled in the art should understand, however, that the conduction periods for the main and auxiliary power semiconductor switches $Q_{mn}$, $Q_{aux}$ may be separated by a small time interval to avoid cross conduction therebetween and beneficially to reduce the switching losses associated with the power converter. A drain terminal VRAIN (also referred to as a "switched terminal" and a "common node") with respect to the main and auxiliary power semiconductor switches $Q_{mn}$, $Q_{aux}$ and a ground terminal PGND of the power converter are also designated in FIG. 1.

The controller 120 receives a desired characteristic such as a desired system voltage $V_{system}$ from an internal or external source associated with the microprocessor, and the output voltage $V_{out}$ of the power converter. The controller 120 is also coupled to the input voltage PVIN of the power converter and a return lead of the source of electrical power (again, represented by a battery) to provide a ground connection therefor. A decoupling capacitor $C_{dec}$ is coupled to the path from the input voltage PVIN to the controller 120. The decoupling capacitor $C_{dec}$ is configured to absorb high frequency noise signals associated with the source of electrical power to protect the controller 120.

In accordance with the aforementioned characteristics, the controller 120 provides a signal (e.g., a pulse width modulated ("PWM") signal $S_{PWM}$) to control a duty cycle and a frequency of the main and auxiliary power semiconductor switches $Q_{mn}$, $Q_{aux}$ of the power train 110 to regulate the output voltage $V_{out}$ thereof. The controller 120 may also provide a complement of the signal (e.g., a complementary pulse width modulated signal $S_{1-PWM}$) in accordance with the aforementioned characteristics. Any controller adapted to control at least one semiconductor switch of the power converter is well within the broad scope of the present invention. As an example, a controller employing digital circuitry is disclosed in U.S. Pat. No. 7,038,438, entitled "Controller for a Power Converter and a Method of Controlling a Switch Thereof," to Dwarakanath, et al. and U.S. Pat. No. 7,019,505, entitled "Digital Controller for a Power Converter Employing Selectable Phases of a Clock Signal," to Dwarakanath, et al., which are incorporated herein by reference.

The power converter also includes the driver 130 configured to provide drive signals (e.g., gate drive signals) $S_{DRV1}$, $S_{DRV2}$ to the main and auxiliary power semiconductor switches $Q_{mn}$, $Q_{aux}$, respectively, based on the PWM and complementary PWM signals $S_{PWM}$, $S_{1-PWM}$ provided by the controller 120. There are a number of viable alternatives to implement a driver 130 that include techniques to provide sufficient signal delays to prevent crosscurrents when controlling multiple power semiconductor switches in the power converter. The driver 130 typically includes active elements such as switching circuitry incorporating a plurality of driver switches that cooperate to provide the drive signals $S_{DRV1}$, $S_{DRV2}$ to the main and auxiliary power semiconductor switches $Q_{mn}$, $Q_{aux}$. Of course, any driver 130 capable of providing the drive signals $S_{DRV1}$, $S_{DRV2}$ to control a semiconductor switch is well within the broad scope of the present invention. As an example, a driver is disclosed in U.S. Pat. No. 7,330,017, entitled "Driver for a Power Converter and Method of Driving a Switch Thereof," to Dwarakanath, et al., which is incorporated herein by reference. Also, an embodiment of a semiconductor device that may embody portions of the power conversion circuitry is disclosed in U.S. Pat. No. 7,230,302, entitled "Laterally Diffused Metal Oxide Semiconductor Device and Method of Forming the Same," to Lotfi, et al., and U.S. patent application Ser. No. 14/091,739, entitled "Semiconductor Device including Alternating Source and Drain Regions, and Respective Source and Drain Metallic Strips," to Lotfi, et al., which are incorporated herein by reference, and an embodiment of an integrated circuit embodying power conversion circuitry, or portions thereof, is disclosed in U.S. Pat. No. 7,015,544, entitled "Integrated Circuit Employable with a Power Converter," to Lotfi, et al., which is incorporated by reference.

A module such as a power module formed with multiple packaging subassemblies in a common package for multiple circuits (embodied, at least in part, in semiconductor devices) such as two power converters is introduced that provides substantially minor-symmetric positioning of the module terminals (i.e., the pinout) for external connections to the module. In an illustrative embodiment, a dual power converter module is described that is formed with two independent one-ampere dc-dc power converters. A 6×4× 1.15 millimeter ("mm"), 36 lead, quad-flat no-lead ("QFN") package is used in an illustrative embodiment to assemble the two dc-to-dc power converters side-by-side onto a single leadframe. The completed package provides symmetric module terminals/pinout for each dc-to-dc power converter with a pin-for-pin match of module terminals between the left- and right-side dc-to-dc power converters. Correspondingly, a semiconductor device is introduced with input and output terminals (i.e., pads) positioned in a substantially mirror-symmetric arrangement on the semiconductor device to facilitate wirebonding from the input and output terminals of the semiconductor device to pads substantially minor-symmetrically positioned on a leadframe, such as a leadframe formed on an upper surface of a printed circuit board of the module.

The resulting module structure is formed with two instances of a semiconductor device (e.g., the same piece of silicon) that is designed with a substantially mirror symmetric arrangement of terminals so it can be assembled either on the left side or the right side of the module. This arrangement results in a dual product (e.g., a dual power product) with, for instance, inputs on one side and outputs on another side that can feed dual loads without substantial layout inconvenience for an end product. Thus, both loads can be readily fed on the same side. In an embodiment, the resulting module structure is formed to feed a plurality of loads.

An electronic package assembly is formed by providing a patterned conductor on an upper surface of a printed circuit board, mounting a discrete passive element such as magnetic device on the upper surface of the printed circuit board proximate the patterned conductor, and mounting a semiconductor device above an upper surface of the discrete passive element. An example of module having stacked elements is described in U.S. Pat. No. 8,153,473, entitled "Module Having a Stacked Passive Element and Method of Forming the Same," to Lotfi, et al., and U.S. Pat. No. 8,266,793, entitled "Module Having a Stacked Magnetic Device and Semiconductor Device and Method of Forming the Same," to Lotfi, et al., which are incorporated herein by reference.

In an embodiment, a module utilizes a dual package design formed with two instances of a semiconductor device (e.g., a same piece of silicon) formed with a silicon complementary metal-oxide semiconductor/field-effect transistor ("Si CMOS/FET") die and two instances of a stacked inductor. A dual dc-to-dc power converter package structure is thereby created that employs a substantially minor-symmetric Si CMOS/FET die design for application on left and right side of a module, and two instances thereof on inductors. Semiconductor device symmetry provides ease in package assembly resulting in low cost, and a semiconductor device stacked on an inductor provides a compact package size.

Figure 2A:
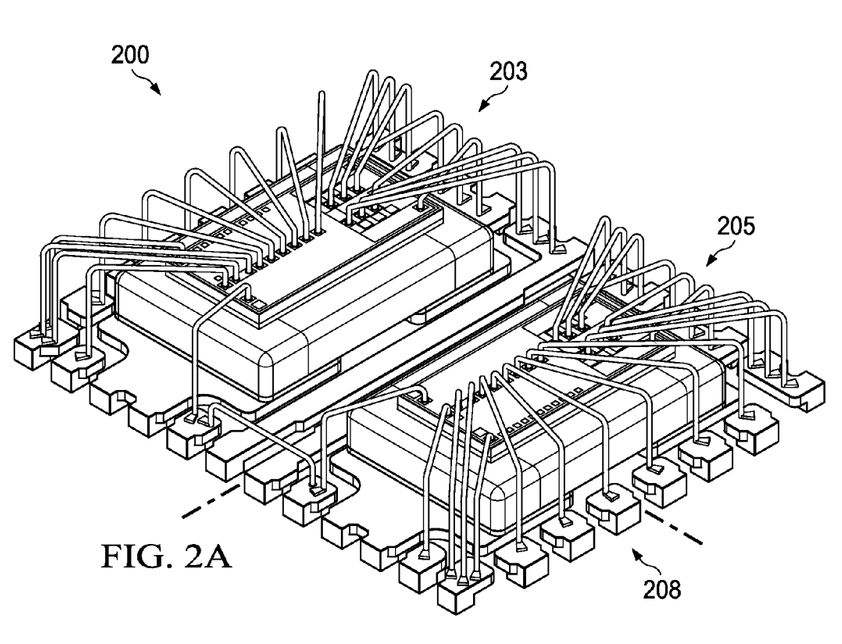
FIGS. 2A and 2B illustrate isometric views of a module and a stack-up of components of portions of the module, respectively.
Figure 2B:
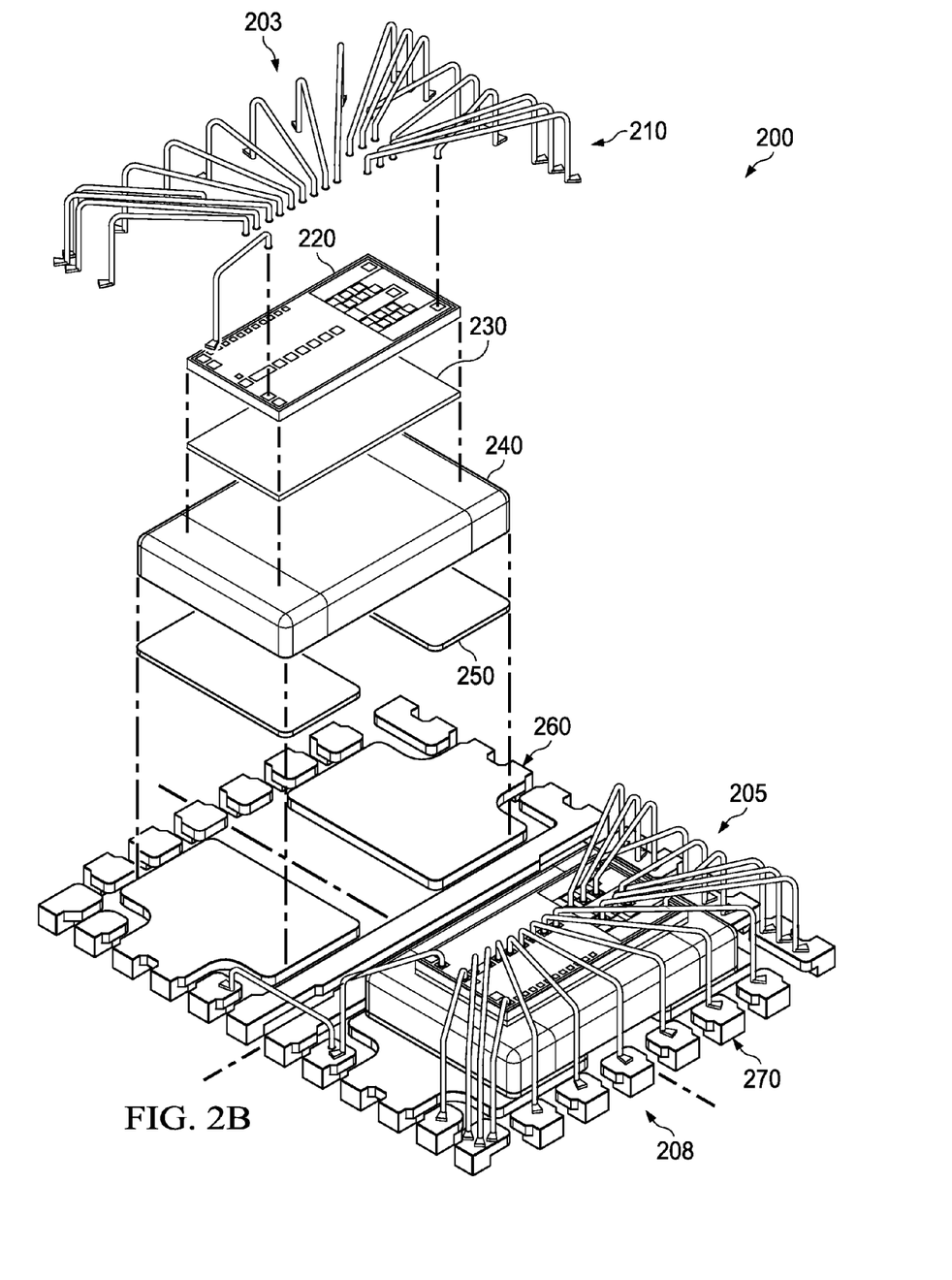

Turning now to FIGS. 2A and 2B, illustrated are isometric views of a module 200 (e.g., a power module) and a stack-up of components of portions of the module 200, respectively. The module 200 is packaged with multiple circuits (embodied, at least in part, in semiconductor devices) such as two power converters (first and second power converters 203, 205), with the stack-up of the first power converter 203 illustrated in FIG. 2B. A base of the module 200 is a 0.150 mm (6 mil) copper ("Cu") patterned leadframe 208 (a conductive leadframe). The conductive leadframe 208 provides mounting pads (or terminals) for assembly of the component stack-up and separate terminals for module interconnects. Ones of the mounting pads (or terminals) have substantially minor-symmetric arrangement (e.g., mirrored opposing side or left-right symmetry) for the two power converters.

Two principal components for each of the power converters 203, 205 is a passive element (e.g., a chip inductor 240 such as a 2520-size chip inductor) and a semiconductor die (e.g., a Si CMOS/FET die 220) embodied in a semiconductor device. Solder paste 250 is applied (stenciled) to the leadframe mounting pads (e.g., leadframe mounting pads 260), and the chip inductors 240 are placed into the solder paste 250 and reflowed to form an electrical connection to the conductive leadframe 208. A die-attach adhesive 230 is dispensed onto the top surface of the chip inductors 240 and the Si CMOS/FET die 220 are mounted thereon. Finally, wire bonds 210 provide the interconnections from the Si CMOS/FET die 220 to external module terminals (one of which is designated 270).

The die-attach adhesive 230 is a thermally conductive and electrically insulating material dispensed on the chip inductors 240 to form an upper planar surface that acts as a die-attach layer for Si CMOS/FET die 220 that is adhesively bonded thereon. An exemplary thermally conductive and electrically insulating die-attach adhesive 230 is epoxy. The die-attach adhesive 230 is cured, typically in a controlled thermal process, to secure the Si CMOS/FET die 220 to the chip inductors 240. An exemplary thermally conductive and electrically insulating die-attach adhesive 230 used to mount the Si CMOS/FET die 220 onto the chip inductors 240 is Ablebond 2025D from Ablestik, Rancho Dominguez, Calif. The thermally conductive and electrically insulating die-attach adhesive 230 is dispensed (applied) onto the chip inductors 240 and the Si CMOS/FET die 220 is pressed into the thermally conductive and electrically insulating die-attach adhesive 230, forcing spreading of the same under the Si CMOS/FET die 220 to obtain an exemplary 75 percent ("%") coverage of the bottom surface of the Si CMOS/FET die 220. A curing process in an in-line oven for up to about 45 minutes at about 175 degrees Celsius is used to cure the thermally conductive and electrically insulating die-attach adhesive 230.

In general, a semiconductor die (embodied in the semiconductor device) is formed with at least one semiconductor switch and a control element such as the controller 120 and/or the driver 130 illustrated and described hereinabove with reference to FIG. 1. In an embodiment, the input and output terminals of the semiconductor device, which provide electrical contacts to a semiconductor switch and a control element collectively number at least six terminals. To obtain opposing side (e.g., left- and right-side) symmetry in a module without the expense of maintaining left- and right-side components, the design of the module utilizes the analogous components for each circuit (e.g., the left-side and right-side power converters) that share the same design for the passive element and the semiconductor die within each semiconductor device.

Figure 3:
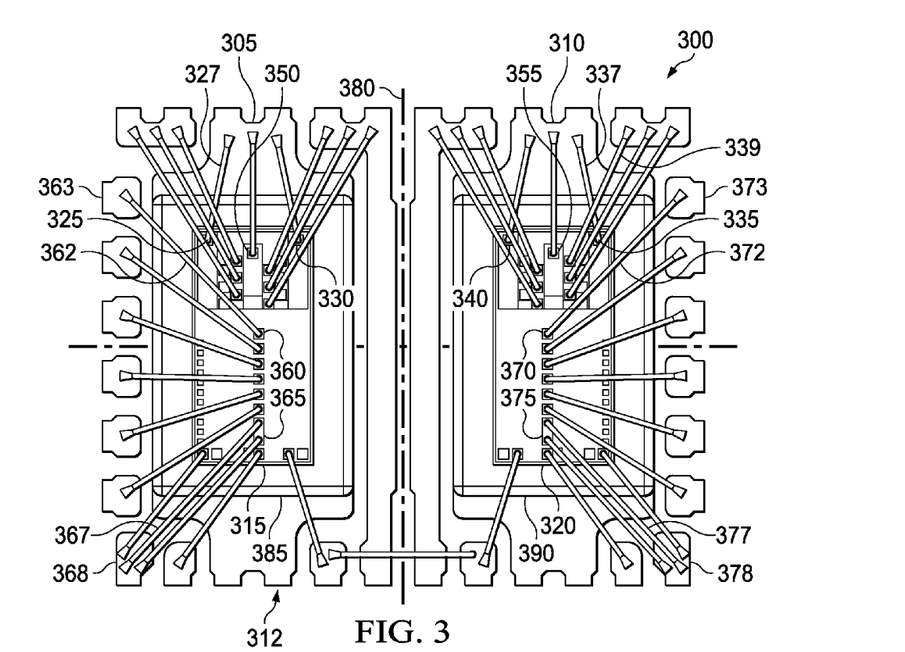
FIG. 3 illustrates a top-view of an embodiment of a module.

Turning now to FIG. 3, illustrated is a top-view of an embodiment of a module 300. The module 300 includes first and second module output terminals 305, 310 (e.g., wire bond pads), formed on a conductive leadframe 312, and first and second semiconductor devices 315, 320 (e.g., a Si CMOS/FET die). The first semiconductor device 315 includes a first output terminal 325 (e.g., a wire bond pad) and a second output terminal 330 (e.g., a wire bond pad) in a substantially minor-symmetric arrangement (e.g., on opposing sides) on the first semiconductor device 315 and coupled to a first common node (see FIG. 5) of the first semiconductor device 315. The second semiconductor device 320 includes a third output terminal 335 (e.g., a wire bond pad) and a fourth output terminal 340 (e.g., a wire bond pad) in a substantially mirror-symmetric arrangement (e.g., on opposing sides) on the second semiconductor device 320 and coupled to a second common node (see FIG. 5) of the second semiconductor device 320. At least one of the first and second output terminals 325, 330 is coupled (via wire bonds, one of which is designated 327) to the first module output terminal 305, and at least one of the third and fourth terminals 335, 340 is coupled (via wire bonds, one of which is designated 337) to the second module output terminal 310. The first and second module output terminals 305, 310 are in a substantially minor-symmetric arrangement on the module 300.

The first semiconductor device 315 further includes a substantially center-positioned output terminal (e.g., a fifth output terminal 350 such as a wire bond pad) coupled to the first common node and the second semiconductor device 320 further includes a substantially center-positioned output terminal (e.g., a sixth output terminal 355 such as a wire bond pad) coupled to the second common node. At least two of the first, second and fifth output terminals 325, 330, 350 (and as illustrated all three terminals) are coupled (via wire bonds, one of which is designated 327) to the first module output terminal 305 and at least two of the third, fourth and sixth output terminals 335, 340, 355 (and as illustrated all three terminals) are coupled (via wire bonds, one of which is designated 337) to the second module output terminal 310.

The first semiconductor device 315 also includes a first control input terminal 360 (e.g., a wire bond pad) and a second control input terminal 365 (e.g., a wire bond pad) substantially center-positioned on the first semiconductor device 315 and wire bonded (via wire bonds 362, 367, respectively) to first and second module control input terminals 363, 368, respectively. The second semiconductor device 320 includes a third control input terminal 370 (e.g., a wire bond pad) and a fourth control input terminal 375 (e.g., a wire bond pad) substantially center-positioned on the second semiconductor device 320 and wire bonded (via wire bonds 372, 377, respectively) to third and fourth module control input terminals 373, 378, respectively. In general, the module terminals for the respective first and second semiconductor devices 315, 320 are in a substantially mirror-symmetric arrangement on the module 300. In other words, using a centerline 380 through the module 300 as a reference point, the module terminals on one side (e.g., the left side) are in a substantially mirror-symmetric arrangement with the module terminals on the other side (e.g., the right side).

The first and second semiconductor devices 315, 320 are positioned over and affixed to first and second discrete passive elements 385, 390, respectively, with a die-attach adhesive (see FIG. 2B). The first and second discrete passive elements 385, 390 may be inductors such as a chip inductor. The first and second discrete passive elements 385, 390 have natural top/bottom design symmetry for an input and output, thereby maintaining package symmetry therefor. The leadframe mounting pads (see FIG. 2B) for the first and second discrete passive elements 385, 390 are further designed to orient a symmetry of the first and second discrete passive elements 385, 390. The module 300 is further encapsulated with an encapsulant formed about the first and second semiconductor devices 315, 320 and the first and second discrete passive elements 385, 390 (see FIG. 6).

As evident from FIG. 3, the wire bonds (e.g., wire bond 327) with respect to the first semiconductor device 315 are extended principally to the left, and the wire bonds (e.g., wire bond 337) with respect to the second semiconductor device 320 are extended principally to the right with respect to the centerline 380. The first and second semiconductor devices 315, 320 are bonded upwards in the module 300, but again maintain substantial symmetric orientations therein. Again, the first and second semiconductor devices 315, 320 are designed to allow substantially minor-symmetric wire bonding from both the left and right sides to accommodate placement within the module (a dual package module). To obtain this substantially mirror-symmetric device symmetry, both substantially centering and dual positioning of device bond pads are used. This also results in the need to provide substantially minor symmetry in the design of the first and second discrete passive elements 385, 390.

The substantially minor-symmetric positioning of input and output terminals of the first and second semiconductor devices 315, 320 enables substantially mirror-symmetric extension of the wire bonds in opposing directions to the module input and the output terminals without excessive centrally located wire-bond crossovers. As illustrated in FIG. 3, a wire bond 339 slightly crosses an end of the wire bond 337 at a substantially centrally located position thereof. Such wire bond crossing at an end of another wire bond avoids accidental contact between the wire bonds, especially after a package molding operation.

Figure 4:
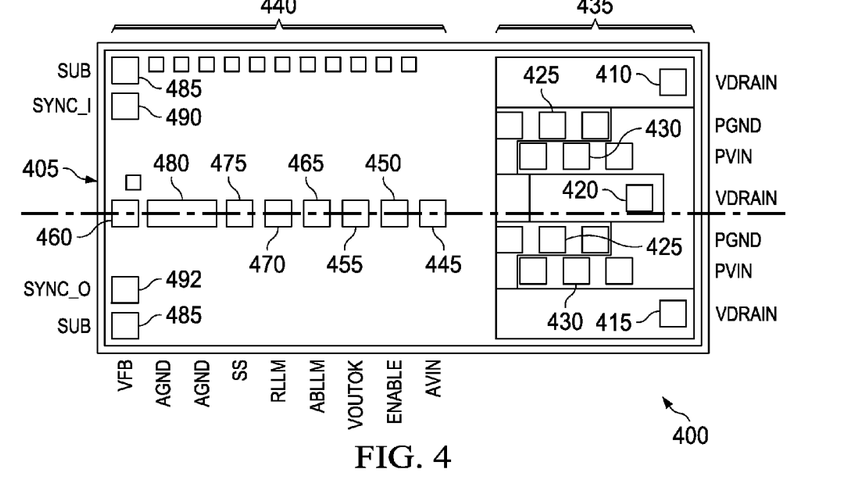
FIG. 4 illustrates a top-view of an embodiment of a semiconductor device.

Turning now to FIG. 4, illustrated is a top-view of an embodiment of a semiconductor device 400 (e.g., including a Si CMOS/FET die). The terminals of the semiconductor device 400 are substantially minor-symmetric or center-positioned thereon. A centerline 405 represents a center-positioned axis of the semiconductor device 400.

Figure 5:
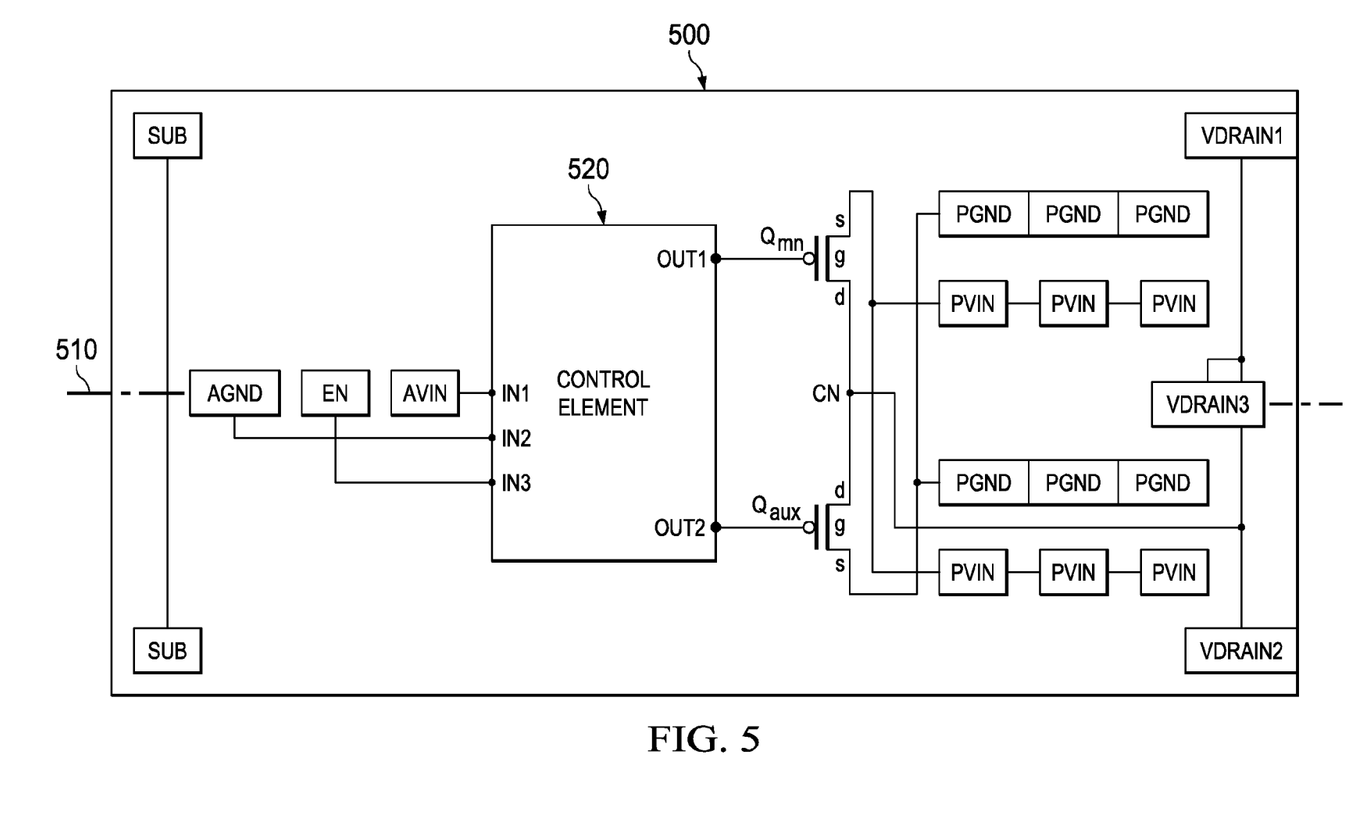
FIG. 5 illustrates a block diagram an embodiment of a portion of a semiconductor device.

The semiconductor device 400 is formed with first, second and third output terminals 410, 415, 420 that provide a common electrical connection, labeled VDRAIN, to a drain terminal (i.e. a common node) of a semiconductor switch(es) (see FIG. 5). The first and second output terminals 410, 415 are in a substantially mirror-symmetric arrangement on the semiconductor device 400, and the third output terminal 420 is substantially center-positioned on the centerline 405 of the semiconductor device 400.

Ground terminals (ones of which are designated 425 and labeled PGND) are substantially minor-symmetric arranged on the semiconductor device 400. Input terminals (ones of which are designated 430 and labeled PVIN) are input voltage terminals and are also substantially mirror-symmetric arranged on the semiconductor device 400. An area designated 435 represents a general location of the semiconductor switch(es) of the semiconductor device 400. As discussed with respect to FIG. 1, the semiconductor switch(es) may be incorporated into a power train of a power converter. An area designated 440 represents a general location of a control element including controllers and drivers (see FIG. 1) for the semiconductor switch(es) of the semiconductor device 400.

A plurality of input and output terminals is substantially center-positioned on the centerline 405 in the control element section 440 of the semiconductor device 400. A control input terminal 445, labeled AVIN, is an input voltage terminal for the control element section 440 of the semiconductor device 400 and a control input terminal 450, labeled ENABLE, provides an enable signal for the control element section 440 of the semiconductor device 400. A control output terminal 455, labeled VOUTOK, provides an indication that an output voltage of a module including the semiconductor device 400 is properly regulated by a controller in accordance with a feedback signal on a control input terminal 460, labeled VFB. Control input terminals 465, 470, labeled ABLLM and RLLM, provide inputs for a low-load mode of operation for the control element section 440 of the semiconductor device 400. A control input terminal 475, labeled SS, provides an input for a soft start for the control element section 440 of the semiconductor device 400. A ground terminal 480, labeled AGND, provides a ground for the control element section 440 of the semiconductor device 400. Additionally, ground terminals (designated 485 and labeled SUB) are substantially minor-symmetric arranged on the semiconductor device 400 and synchronization terminals 490, 492, labeled SYNC_I and SYNC_O, are substantially minor-symmetric arranged on and provide a synchronization input and output, respectively, for the semiconductor device 400.

Substantially center-positioning of terminals allows for either left or right side extension of wire bonds. Typically, edge-positioned bond pads (for the terminals) are designed for wire bonding off the semiconductor device away from the edge and not back across the semiconductor device, which is good practice to prevent wire overlap with accidental contacts of the wire bonds, particularly overlaps/crossovers at centrally located positions of the wire bonds. By designing the semiconductor device to be relatively narrow in width, substantially center-positioning of the terminals/bond pads allows for substantially minor-symmetric wire bonding without centrally located wire bond crossovers above the semiconductor device.

Dual/multiple positioning of bond pads coupled to a common circuit node allows for extension of wire bonds to the left or right without crossover of other wire bonds. Internally interconnected bond pads are located on both the left and right sides of the semiconductor device and can be used either for left- and right-side wire bonding. As an example, see the dual-positioned terminals (e.g., bond pads) in the semiconductor device for both the ground terminals 425 and input terminals 430 as illustrated in FIG. 4.

Turning now to FIG. 5, illustrated is a block diagram an embodiment of a portion of a semiconductor device 500 (e.g., including a Si CMOS/FET die). A centerline 510 represents a center-positioned axis of the semiconductor device 500. The semiconductor device 500 includes a main semiconductor switch Q. (e.g., a laterally diffused metal-oxide semiconductor device) having a control node g and a switched node d. The switched node d is coupled to first and second output terminals VDRAIN 1, VDRAIN 2 (e.g., wire bond pads) of the semiconductor device 500. The first and second output terminals VDRAIN 1, VDRAIN 2 are positioned in a substantially minor-symmetric arrangement on the semiconductor device 500 (e.g., on opposing sides). The semiconductor device 500 also includes an auxiliary semiconductor switch Qaux (e.g., a laterally diffused metal-oxide semiconductor device) having a control node g and a switched node d. The switched node d is coupled to the first and second output terminals VDRAIN 1, VDRAIN 2 of the semiconductor device 500. The switched node d of the main and auxiliary semiconductor switches $Q_{mn}$, $Q_{aux}$ is also coupled to a third output terminal VDRAIN 3 of the semiconductor device 500 substantially center-positioned thereon Thus, a node designated CN represents a common node within the semiconductor device 500. At least two of the first, second and third output terminals VDRAIN 1, VDRAIN 2, VDRAIN 3 are coupleable to an external node (see, e.g., output module terminal 305 of FIG. 3).

Another switched terminal s of the main semiconductor switch $Q_{mn}$ is coupled to input terminals PVIN for an input voltage with ones of the input terminals PVIN being arranged in a substantially minor-symmetric arrangement on the semiconductor device 500. Another switched terminal s of the auxiliary semiconductor switch $Q_{aux}$ is coupled to ground terminals PGND with ones of the ground terminals PGND being arranged in a substantially minor-symmetric arrangement on the semiconductor device 500.

The semiconductor device 500 also includes a control element 520 (e.g., a controller and driver as described with respect to FIG. 1) having first and second input nodes IN1, IN2 and first and second output nodes OUT1, OUT2. The first and second input nodes IN1, IN2 are coupled to first and second control input terminals (voltage input terminal AVIN and ground terminal AGND), respectively, of the semiconductor device 500 and the first and second output nodes OUT1, OUT2 are coupled to the control node g of the main and auxiliary semiconductor switches $Q_{mn}$, $Q_{aux}$, respectively. The first and second control input terminals AVIN, AGND (e.g., wire bond pads) are substantially center-positioned on the semiconductor device 500. The control element 520 also includes a third input node IN3 coupled to a third control input terminal (an enable terminal EN) of the semiconductor device 500 substantially center-positioned thereon. The semiconductor device 500 may include other input and/or output terminals such as ground terminals SUB positioned in a substantially minor-symmetric arrangement on the semiconductor device 500 (e.g., on opposing sides). Additionally, the control element 520 may include other input and output nodes coupled to respective terminals of the semiconductor device 500.

Figure 6:
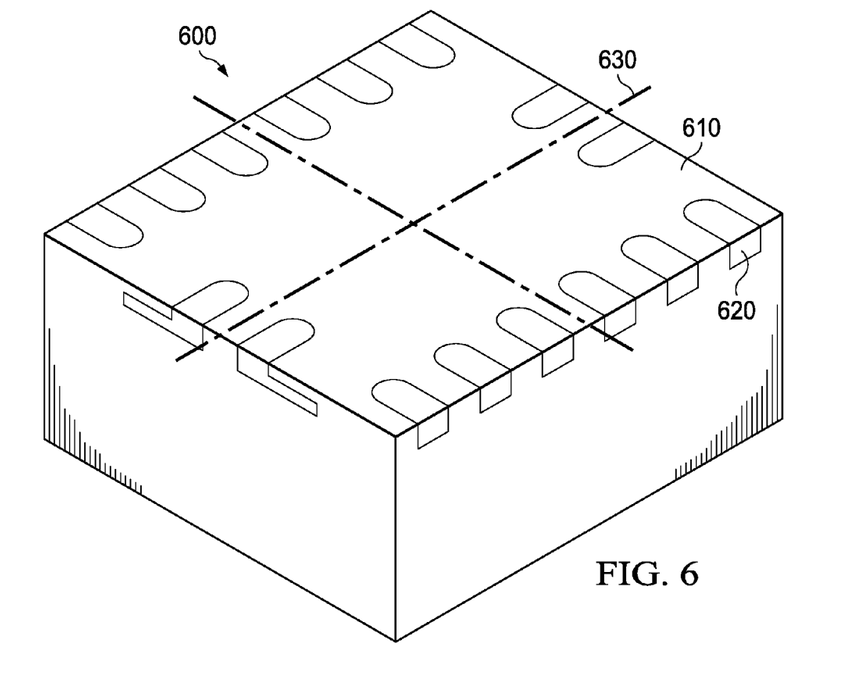
FIG. 6 illustrates an isometric view of an embodiment of a module after encapsulation by transfer molding with an encapsulant.

Turning now to FIG. 6, illustrated is an isometric view of an embodiment of a module (e.g., a power module) 600 after encapsulation by transfer molding with an encapsulant 610 such as an epoxy material. A thermo-setting encapsulant material can be used such as an epoxy molding compound from Sumikon EME-G770LC from Sumitomo Bakelite, Tokyo, Japan employing a transfer molding process to form a surface-mount power module 600. Ends of the leadframe such as end 620 are exposed about the encapsulant 610 with electrically conductive ends for contact to an external circuit element, such as a printed circuit board, substrate, or the like. Module terminals formed by the exposed ends 620 of the power module 600 are positioned in a substantially minor-symmetric terminal arrangement about a centerline 630 that enables a substantially symmetric left and right layout of external circuit elements to be coupled to the power module 600.

Figure 7:
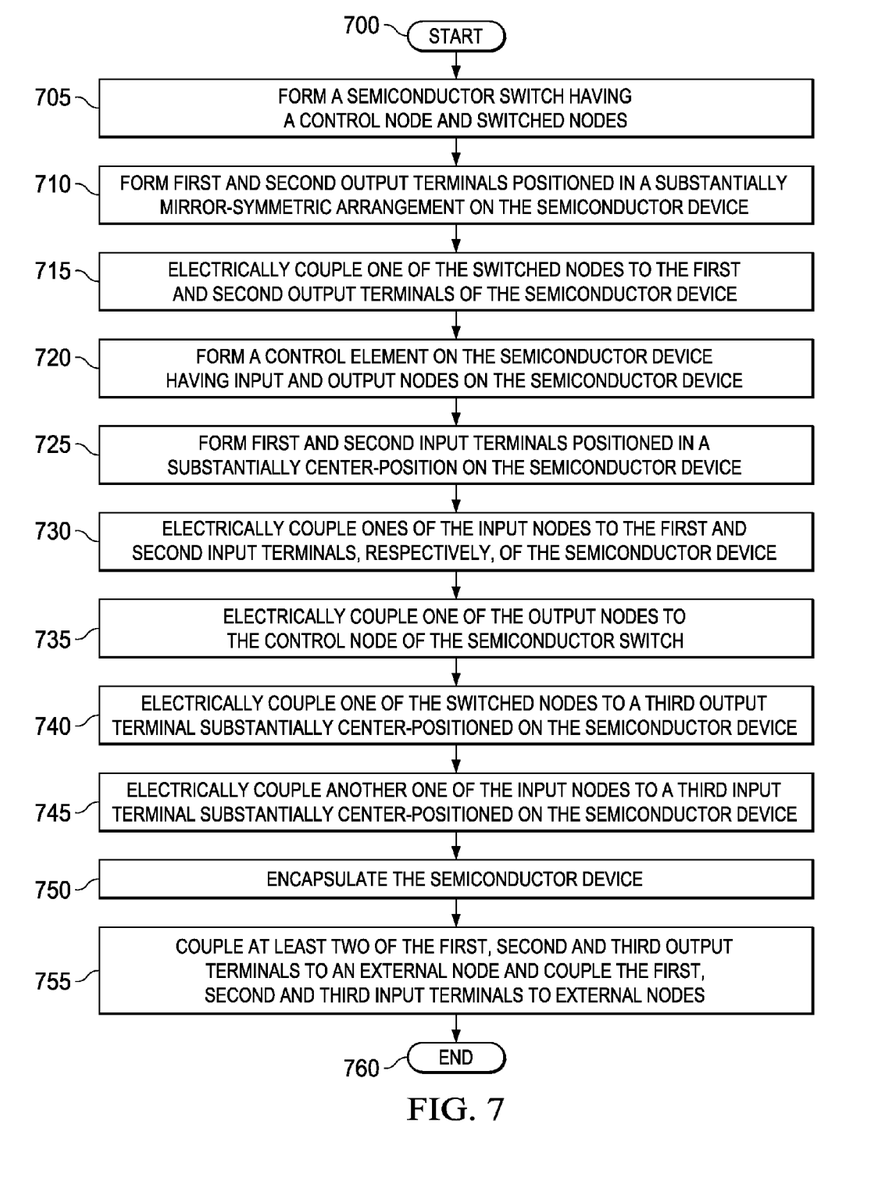
FIG. 7 illustrates a flow diagram of an embodiment of a method of forming a semiconductor device.

Turning now to FIG. 7, illustrated is a flow diagram of an embodiment of a method of forming a semiconductor device. The method begins in a start step or module 700. At a step or module 705, a semiconductor switch (e.g., a laterally diffused metal-oxide semiconductor device) having a control node and switched nodes is formed on the semiconductor device. At a step or module 710, first and second output terminals (e.g., wire bond pads) are formed and positioned in a substantially minor-symmetric arrangement on the semiconductor device (e.g., on opposing sides). At a step or module 715, one of the switched nodes is electrically coupled to the first and second output terminals of the semiconductor device. At a step or module 720, a control element (e.g., controller and driver) is formed on the semiconductor device having input nodes and output nodes on the semiconductor device. At a step or module 725, first and second input terminals are formed and substantially center-positioned on the semiconductor device. At a step or module 730, ones of the input nodes are electrically coupled to the first and second input terminals, respectively, of the semiconductor device.

At a step or module 735, one of the output nodes is electrically coupled to the control node of the semiconductor switch. At a step or module 740, one of the switched nodes is electrically coupled to a third output terminal substantially center-positioned on the semiconductor device. At a step or module 745, another one of the input nodes is electrically coupled to a third input terminal substantially center-positioned on the semiconductor device. In a step or module 750, an encapsulant (e.g. an epoxy) is formed about the semiconductor device. In step or module 755, at least two of the first, second and third output terminals are coupleable to an external node, and the first, second and third input terminals are coupleable to external nodes. The method ends at step or module 760.

Figure 8:
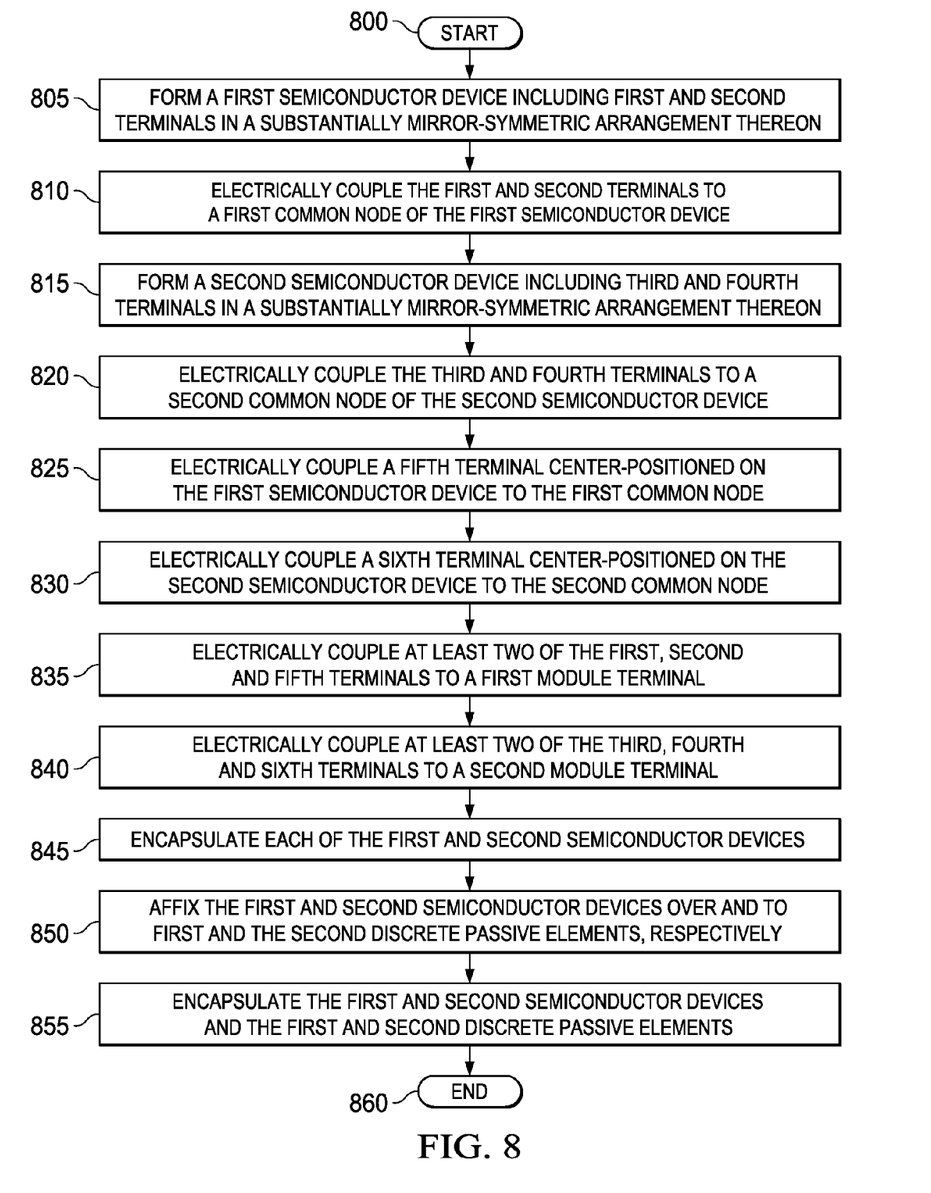
FIG. 8 illustrates a flow diagram of an embodiment of a method of forming a module.

Turning now to FIG. 8, illustrated is a flow diagram of an embodiment of a method of forming a module. The method begins in a start step or module 800. At a step or module 805, a first semiconductor device is formed including first and second terminals in a substantially minor-symmetric arrangement thereon (e.g., on opposing sides). At a step or module 810, the first and second terminals are electrically coupled to a first common node of the first semiconductor device. At a step or module 815, a second semiconductor device is formed including third and fourth terminals in a substantially minor-symmetric arrangement thereon (e.g., on opposing sides). At a step or module 820, the third and fourth terminals are electrically coupled to a second common node of the second semiconductor device. At a step or module 825, a fifth terminal substantially center-positioned on the first semiconductor device is electrically coupled to the first common node. At a step or module 830, a sixth terminal substantially center-positioned on the second semiconductor device is electrically coupled to the second common node. At a step or module 835, at least two of the first, second and fifth terminals are electrically coupled (e.g., wire bonded) to a first module terminal on a conductive leadframe of the module. At a step or module 840, at least two of the third, fourth and sixth terminals are electrically coupled (e.g., wire bonded) to a second module terminal on a conductive leadframe of the module. The first and second module terminals are in a substantially minor-symmetric arrangement on the module (e.g., on opposing sides).

In a step or module 845, an encapsulant (e.g. an epoxy) is formed about each of the first and second semiconductor devices. At a step or module 850, the first and second semiconductor devices are positioned over and affixed to first and the second discrete passive elements (e.g., inductors), respectively, with a die-attach adhesive. In a step or module 860, an encapsulant (e.g. an epoxy) is formed about the first and second semiconductor devices and the first and the second discrete passive elements. The method ends at step or module 855.

Those skilled in the art should understand that the previously described embodiments of a module and semiconductor device and related methods of constructing the same are submitted for illustrative purposes only. While the semiconductor device and the module have been described in the environment of power electronics, other applications are well within the broad scope of the present invention.

For a better understanding of integrated circuits, semiconductor devices and methods of manufacture therefor see "Semiconductor Device Fundamentals," by R. F. Pierret, Addison-Wesley (1996), and "Handbook of Sputter Deposition Technology," by K. Wasa and S. Hayakawa, Noyes Publications (1992). For a better understanding of power converters, see "Modern DC-to-DC Switchmode Power Converter Circuits," by Rudolph P. Severns and Gordon Bloom, Van Nostrand Reinhold Company, New York, N. Y. (1985) and "Principles of Power Electronics," by J. G. Kassakian, M. F. Schlecht, and G. C. Verghese, Addison-Wesley (1991). The aforementioned references are incorporated herein by reference in their entirety.

Also, although the present invention and its advantages have been described in detail, it should be understood that various changes, substitutions, and alterations can be made herein without departing from the spirit and scope of the invention as defined by claims on embodiments. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, claims on embodiments are intended to include within their scope such processes, machines, manufacture, compositions of matter, means, methods, or steps.

What is claimed is:

1. A semiconductor device, comprising:
   a semiconductor die, comprising:
   a semiconductor switch having a control node and a switched node, said switched node being coupled to first and second output terminals of said semiconductor die, said first and second output terminals being positioned in a substantially mirror-symmetric arrangement about a centerline of said semiconductor die; and
   a control element having first and second input nodes and an output node, said first and second input nodes being directly coupled to first and second input terminals, respectively, of said semiconductor die and said output node being coupled to said control node of said semiconductor switch, said first and second input terminals being substantially center-positioned on said centerline of said semiconductor die.

2. The semiconductor device as recited in claim 1, wherein said switched node is coupled to a third output terminal of said semiconductor die substantially center-positioned on said centerline.

3. The semiconductor device as recited in claim 1, wherein said control element further comprises a third input node directly coupled to a third input terminal of said semiconductor die substantially center-positioned on said centerline.

4. The semiconductor device as recited in claim 1, wherein said first and second output terminals are on opposing sides of said semiconductor die.

5. The semiconductor device as recited in claim 1, wherein said switched node is coupled to a third output terminal of said semiconductor die substantially center-positioned on said centerline and at least two of said first, second and third output terminals are coupleable to an external node.

6. The semiconductor device as recited in claim 1, wherein said first and second input terminals and said first and second output terminals comprise wire bond pads.

7. The semiconductor device as recited in claim 1, further comprising an encapsulant formed about said semiconductor device.

8. The semiconductor device as recited in claim 7, wherein said encapsulant comprises epoxy.

9. The semiconductor device as recited in claim 1, wherein said semiconductor switch comprises a laterally diffused metal-oxide semiconductor device.

10. The semiconductor device as recited in claim 1, wherein said control element comprises a controller and a driver.

11. A semiconductor device, comprising:
    a semiconductor die, comprising:
    a semiconductor switch having a control node and a switched node, said switched node being coupled to first, second, and third output terminals of said semiconductor die, said first and second output terminals being positioned in a substantially mirror-symmetric arrangement about a centerline of said semiconductor die, said third output terminal being substantially center-positioned on said centerline of said semiconductor die; and
    a control element having first and second input nodes and an output node, said first and second input nodes being coupled to first and second input terminals, respectively, of said semiconductor die and said output node being coupled to said control node of said semiconductor switch, said first and second input terminals being substantially center-positioned on said centerline of said semiconductor die.

12. The semiconductor device as recited in claim 11, wherein said control element further comprises a third input node coupled to a third input terminal of said semiconductor die substantially center-positioned on said centerline.

13. The semiconductor device as recited in claim 11, wherein said first and second output terminals are on opposing sides of said semiconductor die.

14. The semiconductor device as recited in claim 11, wherein at least two of said first, second and third output terminals are coupleable to an external node.

15. A semiconductor device, comprising:
    a semiconductor die, comprising:
    a semiconductor switch having a control node and a switched node, said switched node being coupled to first and second output terminals of said semiconductor die, said first and second output terminals being positioned in a substantially mirror-symmetric arrangement about a centerline of said semiconductor die; and
    a control element having first and second input nodes and an output node, said first and second input nodes being coupled to first and second input terminals, respectively, of said semiconductor die and said output node being coupled to said control node of said semiconductor switch, said first and second input terminals positioned along a line parallel to first and second edges of said semiconductor die, wherein said first edge is opposite of said second edge, wherein a first distance from said first edge to said first or second input terminal is substantially equal to a second distance from said second edge to said first or second input terminal, such that said first and second input terminals enable access via wire bonds substantially equally from said first edge or second edge.

16. The semiconductor device as recited in claim 15, wherein said switched node is coupled to a third output terminal of said semiconductor die positioned along said line parallel to said first and second edges of said semiconductor die.

17. The semiconductor device as recited in claim 15, wherein said control element further comprises a third input node coupled to a third input terminal positioned along said line parallel to said first and second edges of said semiconductor die.

18. The semiconductor device as recited in claim 15, wherein said first and second output terminals are on opposing sides of said semiconductor die.

19. The semiconductor device as recited in claim 15, wherein said switched node is coupled to a third output terminal of said semiconductor die positioned along said line parallel to said first and second edges of said semiconductor die and at least two of said first, second and third output terminals are coupleable to an external node.

20. The semiconductor device as recited in claim 15, wherein said first and second input terminals and said first and second output terminals comprise wire bond pads.

* * * * *